(12) United States Patent
Tafuru

(10) Patent No.: US 6,542,097 B1
(45) Date of Patent: Apr. 1, 2003

(54) ADAPTIVE DELTA MODULATION WITH STEP SIZE VARIATION RESPONSIVE TO SENSED OVERLOAD

(75) Inventor: Toshihiro Tafuru, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/292,564

(22) Filed: Apr. 15, 1999

(30) Foreign Application Priority Data

Apr. 16, 1998 (JP) .............................. 10-106004

(51) Int. Cl.[7] .................................................. H03M 3/01
(52) U.S. Cl. ........................... 341/143; 341/76; 375/249
(58) Field of Search ............................ 341/76, 77, 143, 341/152; 375/249, 250, 251, 247, 243

(56) References Cited

U.S. PATENT DOCUMENTS 3,908,181 A  *  9/1975  Shigaki et al. .............. 341/143
4,811,019 A  *  3/1989  Julstrom et al. ............. 341/143
5,815,530 A  *  9/1998  Hirai ........................... 375/247

FOREIGN PATENT DOCUMENTS

JP         9-098089     *  4/1997  ............. H03M/3/00

* cited by examiner

Primary Examiner—Howard L. Williams
(74) Attorney, Agent, or Firm—Arent Fox Kintner Plotkin & Kahn PLLC

(57) ABSTRACT

A data conversion device converts a series of digital signals into an analog signal. The device has a current selection circuit that can vary the direction and magnitude of the current it outputs and an integrating circuit that integrates the current supplied from the current selection circuit to output a voltage. The direction of the current is determined in accordance with the digital signals fed in. When the absolute value of the current is great, the value by which the absolute value of the current is increased is decreased, and the value by which the absolute value of the current is decreased is increased.

3 Claims, 17 Drawing Sheets

US 6,542,097 B1

ADAPTIVE DELTA MODULATION WITH STEP SIZE VARIATION RESPONSIVE TO SENSED OVERLOAD

BACKGROUND OF THE INVENTION

1. Field of the Invention

The present invention relates to a data conversion device, and particularly to a delta-modulation-type data conversion device.

2. Description of the Prior Art

For example, to achieve an echo effect or key control in a karaoke apparatus, or to achieve a surround-sound effect in an audio apparatus, it is necessary to add reverberations to an audio signal fed therein, or to store the audio signal in some way. In such cases, only real-time signal processing is possible as long as analog values are handled. For this reason, it is customary to convert the input audio signal into digital values first, then subject the digital values, as a digital signal, to signal processing and signal storage as mentioned above, then convert the digital signal back into an analog signal, and then output it as an audio signal.

A typical method for converting analog values to digital values is to use an analog-to-digital converter (hereafter referred to as an "A/D converter") by which the time-varying voltage of an analog signal as sampled with predetermined timing is represented by a series of digital values each consisting of a plurality of bits in such a way that the actual voltage of the analog signal at one sampling point corresponds to the voltage represented by the digital value consisting of a plurality of bits taken at that sampling point. Another method is to use a delta-modulation-type signal conversion device (hereafter referred to as a "DM-type signal conversion device") by which an input signal to be converted is compared with a reference voltage that varies according to the previous comparison result to obtain a series of values representing voltage variations in such a way that the input signal is represented by a series of digital signals. Still another method is to use an adaptive-delta-modulation-type signal conversion device (hereafter referred to as an "ADM-type signal conversion device") or the like that is developed to offer better trackablility than a DM-type conversion device.

By the use of an A/D converter, it is possible to directly monitor the voltage at a particular sampling point by referring to the corresponding digital value, and this makes digital signal processing easy. However, an A/D converter requires the use of extra components such as ladder resistors and comparators, and therefore needs to be incorporated in a semiconductor integrated circuit device that has a larger chip size and is more expensive. On the other hand, by the use of a DM-type or ADM-type signal conversion device, it is necessary to determine the voltage from a series of digital values, and therefore it is difficult to perform data conversion in such a way as to output a voltage on the basis of a digital signal at an arbitrary time point. However, a DM-type or ADM-type signal conversion device requires a far smaller chip size than an A/D converter, and therefore can be produced inexpensively. For these reasons, for digital signal processing in a low-cost audio apparatus, it is customary to use a DM-type or ADM-type signal conversion device.

A conventional delta-modulation-type data conversion device is disclosed, for example, in Japanese Laid-Open Patent Application No. H9-98089. In this delta-modulation-type data conversion device, to achieve efficient approximation of the input signal by the reference voltage, a current supplied from a current source is varied in steps, and this current is integrated to produce the reference voltage. An A/D converter incorporating this data conversion device converts an analog signal such as an audio signal into a series of digital signals and feeds them to a RAM (random-access memory) for temporary storage. Then, a D/A converter converts the digital signals stored in the RAM into an analog voltage by the use of a data conversion device having the same configuration as the above data conversion device, and then, by subjecting the analog signal to waveform shaping, specifically smoothing, achieved by the use of a low-pass filter, restores the analog signal.

Here, simply feeding the A/D-converted digital signals from the RAM to the signal-restoring-side data conversion device does not enable the signal-restoring-side data conversion device to determine the initial value of the absolute value of the current. As a result, as shown in FIG. 13, when the initial value of the absolute value of the current is great, the data stored in the RAM causes, in the D/A-converter-side data conversion device, the absolute value of the current to vary within a range in which it remains relatively great throughout, as indicated by the curve 30. By contrast, when the initial value of the absolute value of the current is small, the absolute value of the current varies in a range in which it remains relatively small throughout, as indicated by the curve 31, describing a waveform analogous to the curve 30. By integrating the current by the use of an integrating circuit in this data conversion device, a signal is output from the data conversion device. However, the amplitude of the signal voltage output from the D/A converter is different from that of the original signal.

To avoid this, when the A/D converter stores digital signals in the RAM, it is necessary to store, in addition to a series of digital signals, data of the initial value of the current so that the D/A converter first reads this data of the initial value of the current to set the initial value of the absolute value of the current and then restores the analog signal. Accordingly, when the D/A converter restores the analog signal, it is necessary to reset the D/A converter, set the initial value of the absolute value of the current in accordance with the data of the initial value, and then restore the analog signal, starting at the head of the digital signal. Thus, it is impossible to restore the analog signal starting at an arbitrary point other than the head of the digital signal.

SUMMARY OF THE INVENTION

An object of the present invention is to provide a delta-modulation-type data conversion device that does not require initial value data.

To achieve the above object, according to the present invention, a data conversion device for converting a series of digital signals into an analog signal is provided with: a current supplying circuit for supplying a current, the current supplying circuit being capable of varying the direction and magnitude of the current it outputs; an integrating circuit for integrating the current output from the current supplying circuit to output an analog voltage; and a control circuit for determining the direction of the current and whether to increase or decrease the magnitude of the current in accordance with the digital signals, the control circuit, according as the magnitude of the current increases, decreasing the value by which the magnitude of the current is increased and increasing the value by which the magnitude of the current is decreased.

According to this configuration, for example, if the analog signal output from the integrating circuit is compared with an analog signal fed from the outside by the use of a comparator, and the comparison result is fed to the control circuit, it is possible to realize a delta-modulation-type A/D converter that outputs the digital signals output from that comparator. When the thus obtained data is subjected to D/A conversion by the use of the data conversion device of the invention, if the absolute value of the current in the control circuit is great, the data conversion circuit decreases the value by which the absolute value of the current is increased and increases the value by which the absolute value of the current is decreased; by contrast, if the absolute value of the current is small, the data conversion circuit decreases the value by which the absolute value of the current is increased and increases the value by which the absolute value of the current is decreased. Thus, when the initial value of the absolute value of the current in the D/A converter is smaller than the initial value of the absolute value of the current on the A/D conversion side, as time passes, the absolute value of the current gradually increases, and, when the initial value is greater, the absolute value of the current gradually decreases, eventually converging on the original data. As a result, there is no need to previously store the data of the initial value of the current in the A/D and D/A converters in order to restore the original data starting at an arbitrary point within a series of digital data.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
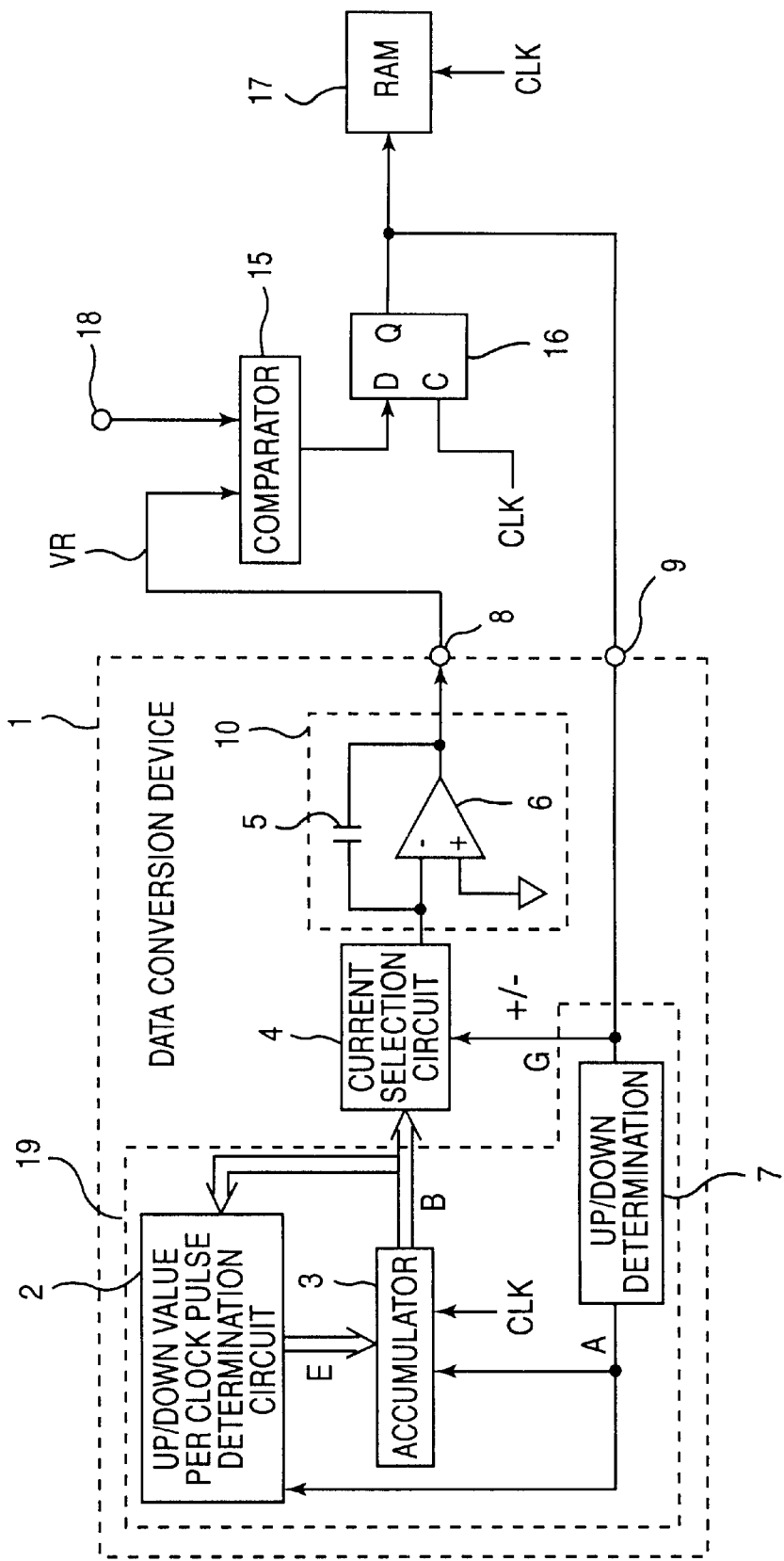
FIG. 1 is a block diagram of an A/D converter embodying the invention.

Hereinafter, embodiments of the present invention will be described with reference to FIGS. 1 to 12. FIG. 1 shows an example of the configuration of the delta-modulation-type A/D converter incorporating a data conversion device embodying the invention. Reference numeral 1 represents a delta-modulation-type data conversion device that converts a digital signal composed of a series of bits into an analog signal. Reference numeral 8 represents an output terminal at which the data conversion device 1 outputs the analog signal. Reference numeral 9 represents an input terminal at which the data conversion device 1 receives the digital signal. Reference numeral 18 represents an input terminal at which the A/D converter receives another analog signal.

Reference numeral 15 represents a comparator that compares the analog signal the A/D converter receives at the input terminal 18 with the analog signal (reference voltage) VR the data conversion device 1 outputs at the output terminal 8. Reference numeral 16 represents a D flip-flop that stores the digital signal. The D flip-flop 16 receives, at its input terminal (D), the result of the comparison performed by the comparator 15, and, at its clock input terminal (C), a clock CLK. Reference numeral 17 represents a RAM that stores, in synchronism with the clock CLK, the digital signal output from the output terminal (Q) of the D flip-flop 16. The digital signal output from the output terminal (Q) of the D flip-flop 16 is fed also to the input terminal 9.

In the data conversion device 1, reference numeral 4 represents a current selection circuit that can vary the direction and magnitude of the current it outputs. Reference numeral 19 represents a control circuit that controls the direction and absolute value of the current output from the current selection circuit 4. Reference numeral 10 represents an integrating circuit that integrates the analog current output from the current selection circuit 4 to convert it into an analog voltage. The analog voltage output from the integrating circuit 10 is fed to the output terminal 8.

The digital signal fed to the input terminal 9 is, as a signal G representing the direction of the current, fed from the control circuit 19 to the current selection circuit 4. In the control circuit 19, reference numeral 7 represents an up/down setting circuit that judges, on the basis of the digital signal fed to the input terminal 9, whether to increase or decrease the absolute value of the current and then outputs a one-bit up/down signal A representing the result of the judgment. The up/down setting circuit 7 outputs the up/down signal A in such a way that the absolute value of the current is increased when the same value appears consecutively in the digital signal fed thereto and that the absolute value of the current is decreased when the value in the digital signal fed thereto shifts from 0 to 1 or from 1 to 0.

Reference numeral 2 represents an up/down value per one clock pulse setting circuit that, on the basis of the up/down signal A and the signal B that a counter 3 outputs as representing the absolute value of the current, outputs the up/down value E by which the absolute value of the current is increased or decreased at every occurrence of a pulse in the clock CLK.

The accumulator, or counter, 3 updates the signal B representing the absolute value of the current at every occurrence of a pulse in the clock CLK. The accumulator 3, in accordance with the up/down signal A fed thereto, updates the signal B representing the absolute value of the current by adding thereto the up/down value E when the absolute value of the current is going to be increased or by subtracting therefrom the up/down value E when the absolute value of the current is going to be decreased.

In the integrating circuit 10, reference numeral 6 represents an operational amplifier. The operational amplifier 6 has its non-inverting input terminal (+) connected to the ground level, and has its inverting input terminal (−) connected to the output side of the current selection circuit 4. A capacitor 5 is connected between the output terminal and the inverting input terminal (−) of the operational amplifier 6. The output voltage of the operational amplifier 6 is fed to the output terminal 8.

Figure 2:
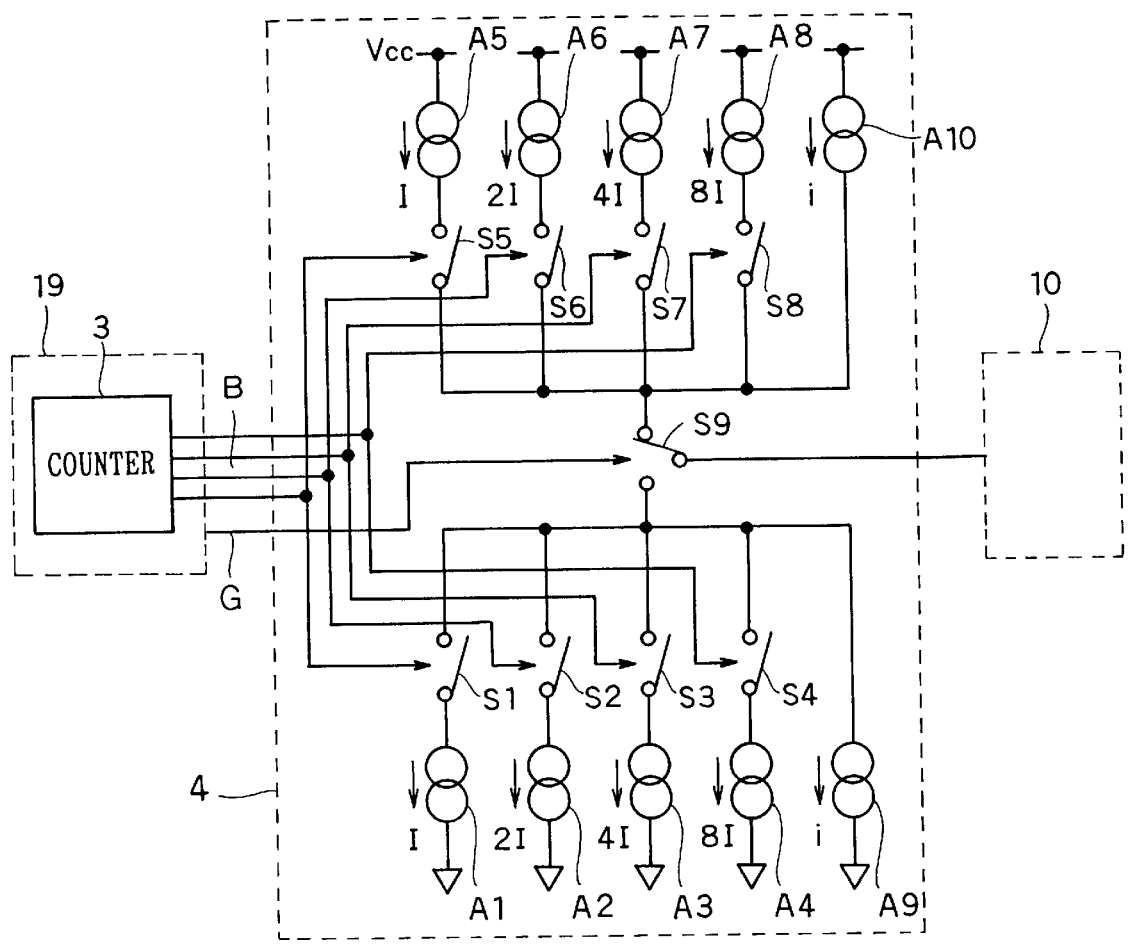
FIG. 2 is a circuit diagram showing the configuration of the current selection circuit of the data conversion device of the A/D converter shown in FIG. 1.

FIG. 2 is a circuit diagram showing the internal configuration of the current selection circuit 4 and how it is connected to the circuits around it. In the current selection circuit 4, reference symbol A1 represents a current source that outputs a current I that is used to increase the output voltage of the integrating circuit 10 (see FIG. 1), reference symbol A2 represents a current source that outputs a current 2I that is used to increase the output voltage of the integrating circuit 10, reference symbol A3 represents a current source that outputs a current 4I that is used to increase the output voltage of the integrating circuit 10, reference symbol A4 represents a current source that outputs a current 8I that is used to increase the output voltage of the integrating circuit 10, and reference symbol A9 represents a current source that outputs a current i that is used to increase the output voltage of the integrating circuit 10 even when the value of the signal B is 0.

Reference symbol A5 represents a current source that outputs a current I that is used to decrease the output voltage of the integrating circuit 10, reference symbol A6 represents a current source that outputs a current 2I that is used to decrease the output voltage of the integrating circuit 10, reference symbol A7 represents a current source that outputs a current 4I that is used to decrease the output voltage of the integrating circuit 10, reference symbol A8 represents a current source that outputs a current 8I that is used to decrease the output voltage of the integrating circuit 10, and reference symbol A10 represents a current source that outputs a current i that is used to decrease the output voltage of the integrating circuit 10 even when the value of the signal B is 0. The current sources A1 to A10 are formed as current mirror circuits composed of transistors having varying areas.

Reference symbols S1 to S8 represent switch circuits that, in accordance with the signal B output from the accumulator 3, select one or more of the current sources A1 to A8 to determine the rate of the current in steps. The signal B is a digital signal consisting of 4 bits. The switches S1 and S5 are controlled by the lowest bit of the signal B. The switches S2 and S6 are controlled by the second lowest bit of the signal B. The switches S3 and S7 are controlled by the third lowest bit of the signal B. The switches S4 and S8 are controlled by the highest bit of the signal B.

Reference symbol S9 represents a switch circuit that, in accordance with the signal G representing the direction of the current, establishes a connection in such a way that, when the output voltage of the integrating circuit 10 is going to be increased, the currents output from the current sources A1 to A4 are fed to the integrating circuit and, when the output voltage of the integrating circuit 10 is going to be decreased, the currents output from the current sources A5 to A8 are fed to the integrating circuit 10.

For example, when the signal B is equal to "0001" in binary notation, the switches S1 and S5 are turned on, and the other switches S2 to S4 and S6 to S8 are turned off. In this case, if the signal G is requesting an increase in the output voltage of the integrating circuit 10, the switch S9 outputs the current I output from the current source A1 and the current I output from the current source A9 to the integrating circuit 10. The switch circuits S1 to S9 are each realized by the use of a transistor.

Although the above description assumes that the current selection circuit 4 is provided with eight current sources A1 to A8, the number of current sources that are to be provided may be determined freely in accordance with the number of bits that are included in the signal B.

Figure 3:
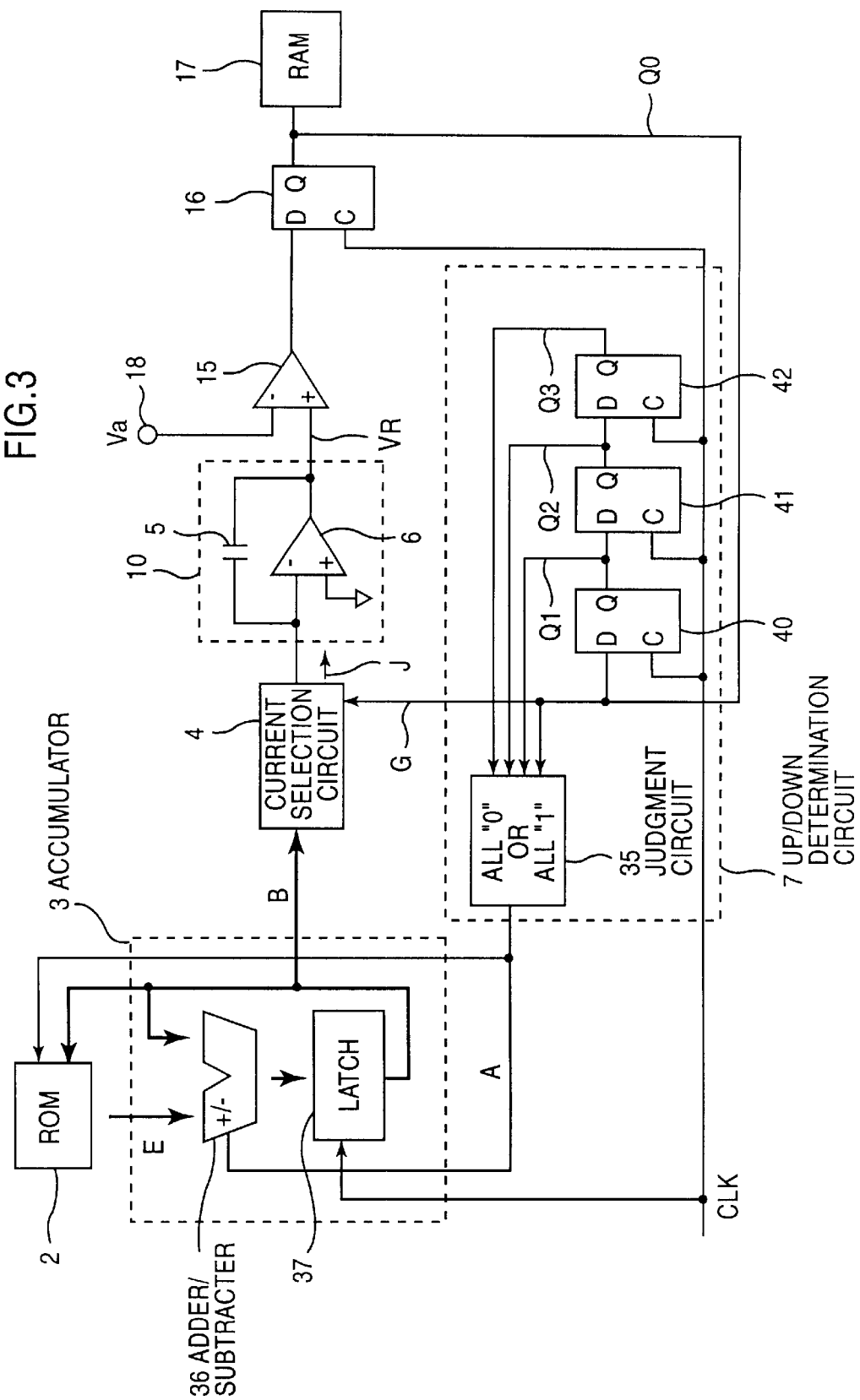
FIG. 3 is a block diagram showing a practical configuration of the A/D converter shown in FIG. 1.

FIG. 3 is a circuit diagram showing a practical configuration of the various portions of the circuit shown in FIG. 1. A comparator 15 receives, at its inverting input terminal (−), the analog voltage fed to the input terminal 18, and, at its non-inverting input terminal (+), the reference voltage VR. Thus, the comparator 15 outputs "0" when the analog voltage fed to the input terminal 18 is higher than the reference voltage VR and outputs "1" when the analog voltage fed to the input terminal 18 is lower than the reference voltage VR.

In the up/down setting circuit 7, reference numeral 40 represents a D flip-flop that receives, at its input terminal (D), a one-bit digital signal Q0 fed from the D flip-flop 16 to the up/down setting circuit 7, and, at its clock input terminal (C), the clock CLK. Reference numeral 41 represents a D flip-flop that receives, at its input terminal (D), a value Q1 output from the output terminal (Q) of the D flip-flop 40, and, at its clock input terminal (C), the clock CLK. Reference numeral 42 represents a D flip-flop that receives, at its input terminal (D), a value Q2 output from the output terminal (Q) of the D flip-flop 41, and, at its clock input terminal (C), the clock CLK. Thus, the D flip-flops 40 to 42 serve as a shift register. The D flip-flop 42 outputs, at its output terminal (Q), a value Q3.

Reference numeral 35 represents a judgment circuit that outputs "1" when the digital signal Q0 fed to the up/down setting circuit 7 and the values Q1 to Q3 output from the D flip-flops 40 to 42 are all "0" or "1" and outputs "0" otherwise. The output of the judgment circuit 35 is used as the up/down signal A.

The up/down value setting circuit 2 is realized by the use of a ROM, which, in response to the address fed thereto as the signals A and B, outputs an up/down value E. In the counter 3, reference numeral 36 represents an adder/subtracter that adds the up/down value E to the value of the signal B when the up/down signal A is "1" and subtracts the up/down value E from the value of the signal B when the up/down signal A is "0". The adder/subtracter 36 operates within a range of values from a minimum value (0) to a certain maximum value, and thus does not output a calculation result that exceeds this range. Reference numeral 37 represents a latch that stores the output of the adder/subtracter 36 at every occurrence of a pulse in the clock CLK, and the output of the latch 37 is used as the signal B. In accordance with the value of the signal B, the absolute value of the current output from the current selection circuit 4 varies in such a way that, the greater the value of the signal B, the greater the absolute value of the current. The current selection circuit 4 outputs a current that flows in the direction indicated by the arrow J when the signal G fed from the up/down setting circuit 7 is "1" and outputs a current that flows in the direction opposite to the arrow J when the signal G is "0".

Figure 4:
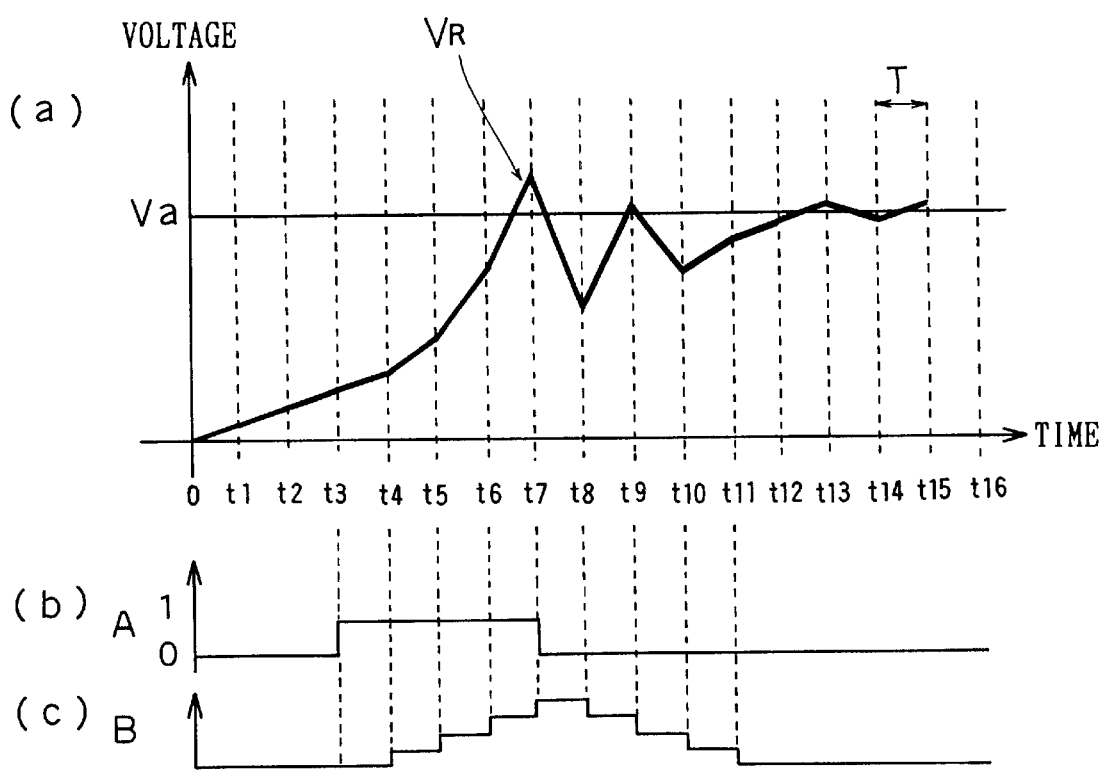
FIG. 4 is a waveform diagram illustrating an example of how the A/D converter shown in FIG. 1 operates.

Next, the operation of the A/D converter shown in FIG. 3 will be described. First, how the A/D converter operates when a direct-current voltage Va is fed to the input terminal 18 will be described. FIG. 4 is a waveform diagram showing the variation with time of the reference voltage VR and of the signals A and B as observed when a direct-current voltage Va is fed to the input terminal 18. In FIG. 4, the lapse of time is taken along the horizontal axis. In FIG. 4, at (a)

are shown the voltage Va fed to the input terminal 18 and the variation with time of the reference voltage VR indicated by a solid zigzag line. The dotted lines perpendicular to the time axis indicate the sampling points according to the clock CLK. Sampling occurs at regular time intervals T. In FIG. 4, at (b) is shown the variation with time of the signal A. In FIG. 4, at (c) is shown the variation of the signal B representing the absolute value of the current.

When the A/D converter is reset at the time point 0, Q1 to Q3 take a value "0101" and the signal B takes a value "0". As shown in FIG. 4, the reference voltage VR is 0, the signal takes a value "0", and the signal B takes a value "0". How these values vary at every occurrence of a pulse in the clock CLK is listed in Table 1 below. Here, the up/down value E per one clock pulse is assumed to be 10 all the time.

TABLE 1

| Time | Q0, Q1, Q2, Q3 | Signal B |
|---|---|---|
| 0 | 0101 | 0 |
| t1 | 0010 | 0 |
| t2 | 0001 | 0 |
| t3 | 0000 | 0 |
| t4 | 0000 | 10 |
| t5 | 0000 | 20 |
| t6 | 0000 | 30 |
| t7 | 1000 | 40 |
| t8 | 0100 | 30 |
| t9 | 1010 | 20 |
| t10 | 0101 | 10 |
| t11 | 0010 | 0 |
| t12 | 0001 | 0 |
| t13 | 1000 | 0 |
| t14 | 0100 | 0 |

After a time interval T from the time point 0, i.e. at the time point t1, Q0 equals "0", and thus the current selection circuit 4 outputs a current that flows in the direction opposite to the arrow J. This slightly increases the reference voltage VR output from the integrating circuit 10. The values of Q0 to Q3 are transferred by the D flip-flops 40 to 42 to become "0010". The signal A takes a value "0", and the signal B takes a value 0.

After another time interval T, i.e. at the time point t2, the reference voltage VR is increased further. Now, Q0 to Q3 take a value "0001". The signal A takes a value "0", and the signal B takes a value 0. After another time interval T, i.e. at the time point t3, the reference voltage VR is increased further. Now, Q0 to Q3 take a value "0000", and thus, as shown at (b) in FIG. 4, the signal A takes a value "1". This causes the up/down value E to be added to the value of the signal B, and thus the adder/subtracter 36 outputs a value 10. The signal B takes a value 0.

After another time interval T, i.e. at the time point t4, the reference voltage VR is slightly increased. Now, Q0 to Q3 take a value "0000", and thus the signal A takes a value "1". The signal B takes a value 10. This causes the up/down value E to be added to the value of the signal B, and thus the adder/subtracter 36 outputs a value 20.

After another time interval T. i.e. at the time point t5, the reference voltage VR is increased with a steeper slope. This is because, at the time point t4, the value of the signal B was 10. Now, Q0 to Q3 take a value "0000", and thus the signal A takes a value "1". The signal B takes a value 20. This causes the adder/subtracter 36 to output a value 30.

After another time interval T, i.e. at the time point t6, the reference voltage VR is increased with a still steeper slope. This is because, at the time point t5, the value of the signal B was 20. Now, Q0 to Q3 take a value "0000", and thus the signal A takes a value "1". The signal B takes a value 30. This causes the adder/subtracter 36 to output a value 40.

After another time interval T, i.e. at the time point t7, the reference voltage VR is increased with a still steeper slope. This is because, at the time point t6, the value of the signal B was 30. Moreover, now the reference voltage VR is higher than the voltage Va, and thus Q0 to Q3 take a value "1000". As a result, the signal A takes a value "0", and the signal B takes a value 40. This causes the adder/subtracter 36 to output a value 30. Now that Q0 equals "1", the current selection circuit 4 outputs a current that flows in the direction indicated by the arrow J, and thus the reference voltage VR starts decreasing.

After another time interval T, i.e. at the time point t8, the reference voltage VR is decreased with a slope based on the value 40 that the signal B took at the time point t7, and thus becomes lower than the voltage Va again. Now, Q0 to Q3 take a value "0100". The signal A takes a value "0", and the signal B takes a value 30. This makes the adder/subtracter 36 to output a value 20. Now that Q0 equals "0", the current selection circuit 4 outputs a current that flows in the direction opposite to the arrow J, and thus the reference voltage increases.

After another time interval T, i.e. at the time point t9, the reference voltage VR is increased to be higher than the voltage Va, and thus Q0 to Q3 take a value "1010". As a result, the signal A takes a value "0", and the signal B takes a value 20. This causes the adder/subtracter 36 to output a value 10. Now that Q0 equals "1", the current selection circuit 4 outputs a current that flows in the direction indicated by the arrow J, and thus the reference voltage starts decreasing.

After another time interval T, i.e. at the time point t10, the reference voltage VR is decreased to be lower than the voltage Va, and thus Q0 to Q3 take a value "0101". As a result, the signal A takes a value "0", and the signal B takes a value 10. This causes the adder/subtracter 36 to output a value "0". Now that Q0 equals "0", the reference voltage VR starts increasing.

After another time interval T, i.e. at the time point t11, Q0 to Q3 take a value "0010". As a result, the signal A takes a value "0", and the signal B takes a value 0. After another time interval T, i.e. at the time point t12, Q0 to Q3 take a value "0001". As a result, the signal A takes a value "0", and the signal B takes a value 0. After another time interval T, i.e. at the time point t13, the reference voltage VR becomes higher than the voltage Va, and thus Q0 to Q3 take a value "1000". As a result, the signal A takes a value "0", and the signal B takes a value 0. After another time interval T, i.e. at the time point t14, the reference voltage VR becomes lower than the voltage Va, and thus Q0 to Q3 take a value "0100". As a result, the signal A takes a value "0", and the signal B takes a value 0.

As described above, when the reference voltage VR is found to be lower than the analog signal fed to the input terminal 18 four times consecutively, the up/down setting circuit 7 turns the signal A to "1" and thereby increases the value of the signal B. In this way, when the up/down setting circuit 7 recognizes that there is a large potential difference between the reference voltage VR and the analog signal fed to the input terminal 18, it increases the value of the signal B so that the reference voltage VR approaches the voltage of the input signal faster.

Figure 5:
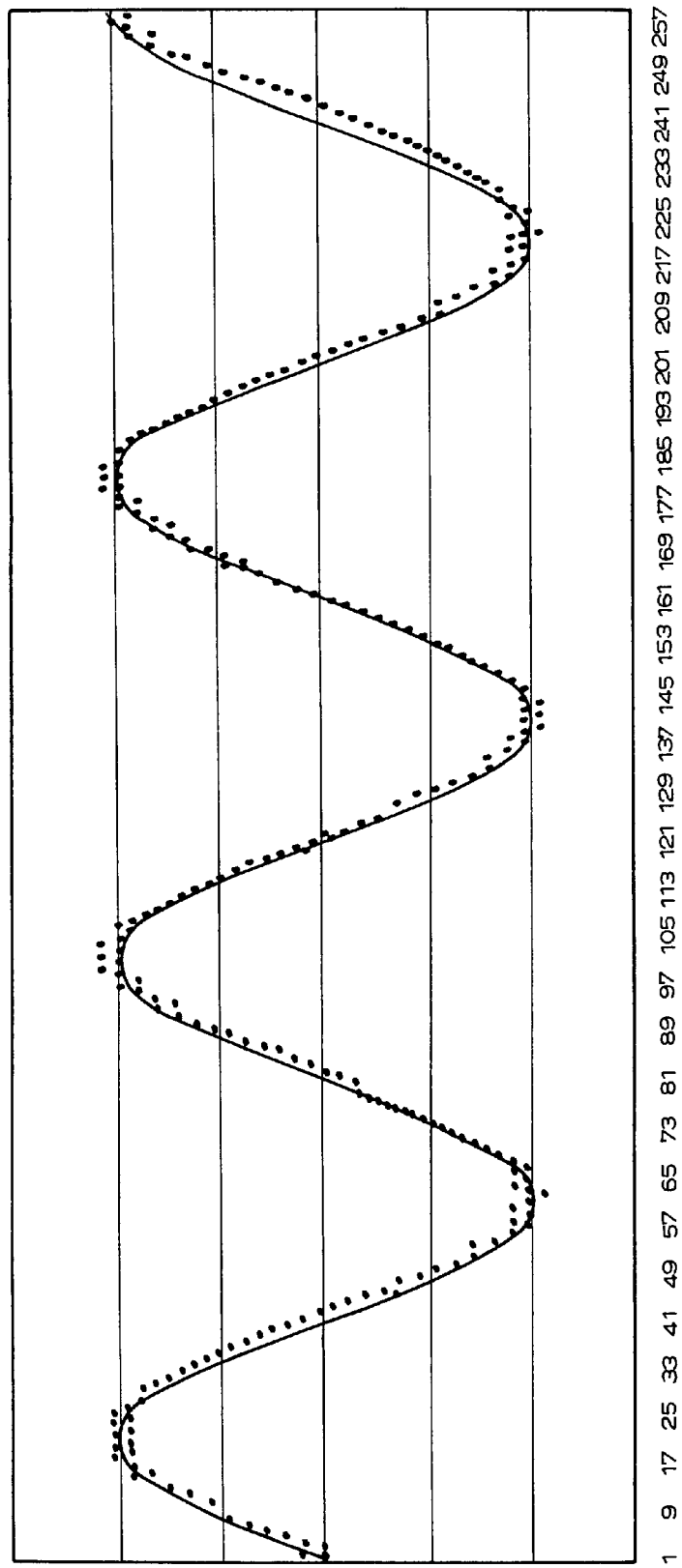
FIG. 5 is a waveform diagram illustrating another example of how the A/D converter shown in FIG. 1 operates.

FIG. 5 is a waveform diagram illustrating how the A/D converter operates when a sine wave is fed to the input terminal 18. In FIG. 5, the time lapse is taken along the horizontal axis, and the voltage level is taken along the vertical axis. The solid line indicates the analog signal fed to the input terminal 18, and the dotted line indicates the reference voltage VR that varies at every occurrence of a pulse in the clock. The counter 3 operates within a range of values from a minimum value 0 to a maximum value 1000, with the initial value set at 500. This point will be described later. The up/down value E is kept constant irrespective of the values of the signals A and B.

The A/D converter, by repeating data conversion operations as described above, stores in the RAM 17 a digital signal that has a waveform equivalent to the voltage waveform of the analog signal fed to the input terminal 18. The digital signal stored in the RAM 17 is then subjected to various kinds of processing to achieve an echo effect, key control, a surround-sound effect, etc.

Figure 6:
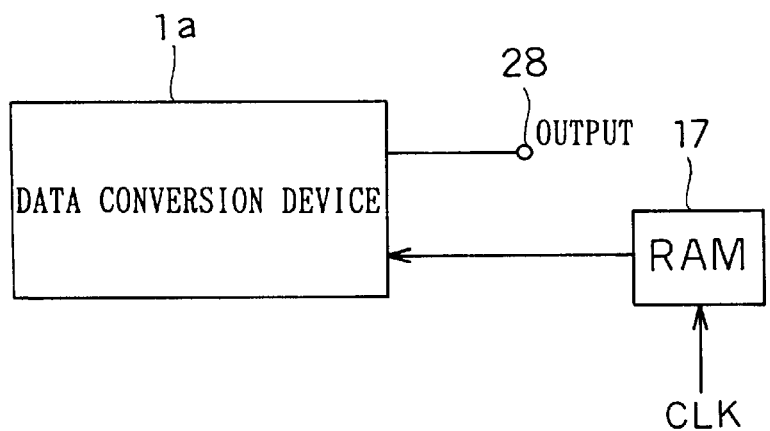
FIG. 6 is a block diagram of a D/A converter embodying the invention.

FIG. 6 is a block diagram showing an example of the configuration of the D/A converter used to restore an analog signal from the digital signal stored in the RAM 17. In FIG. 6, the data conversion device 1a has the same configuration as the data conversion device 1 shown in FIG. 1.

Figure 7:
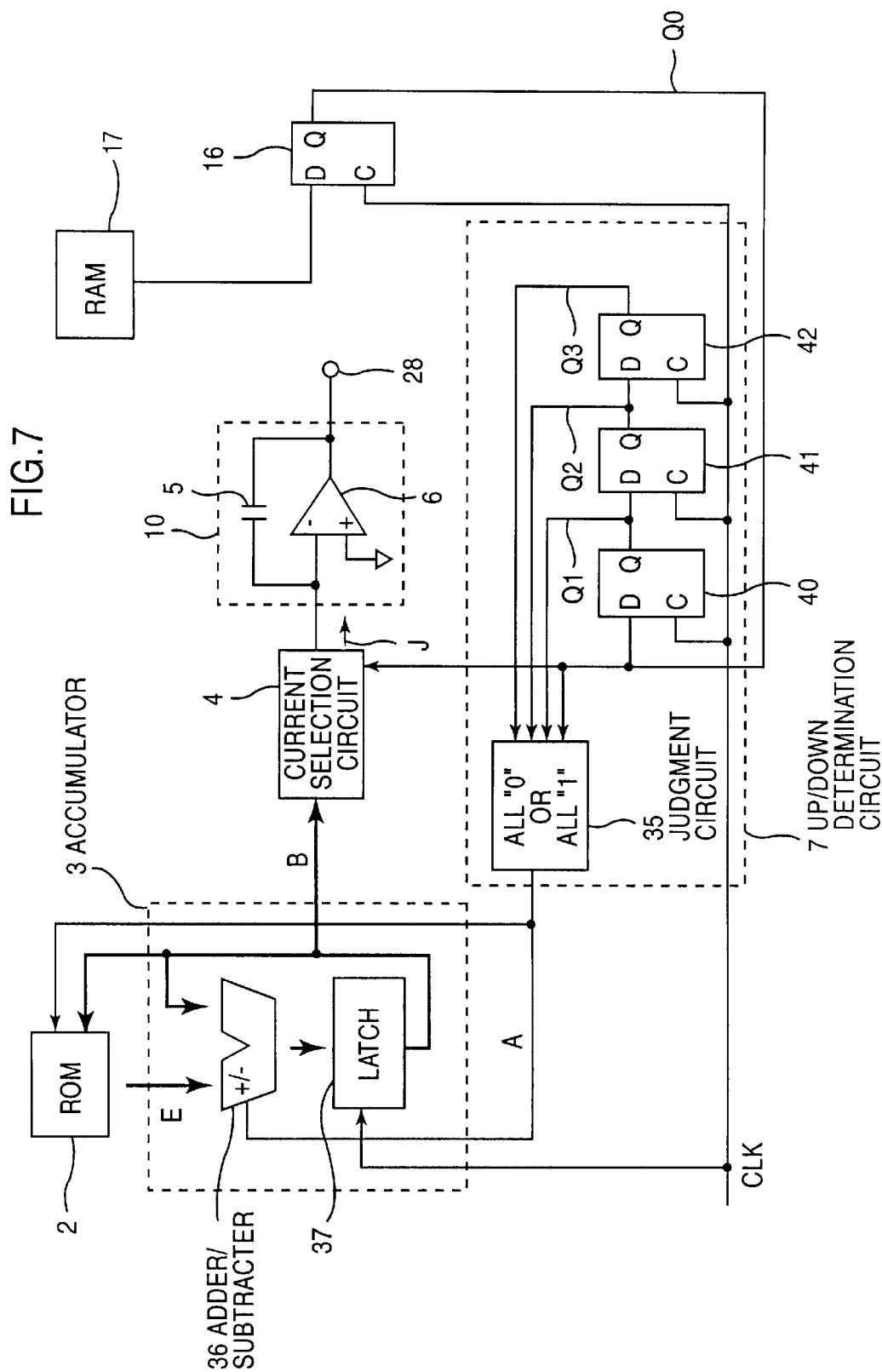
FIG. 7 is a block diagram showing a practical configuration of the D/A converter shown in FIG. 6.

FIG. 7 is a block diagram showing a practical configuration of the D/A converter. In FIG. 7, such elements as are found also in FIG. 3 are identified with the same reference numerals and symbols, and overlapping descriptions will not be repeated. In this D/A converter (FIG. 7), the comparator 15 shown in FIG. 3 is not present; moreover, the one-bit digital signal obtained from the RAM 17 is fed to the input terminal (D) of the D flip-flop 16, and the analog signal obtained from the integrating circuit 10 is fed out via the output terminal 28. In other respects, this D/A converter has the same configuration as the A/D converter shown in FIG. 3.

A one-bit digital signal is fed from the RAM 17 to the data conversion device 1a in synchronism with the clock CLK. In the data conversion device 1a, the control circuit 19 (see FIG. 1) determines the direction and absolute value of the current output from the current selection circuit 4 (see FIG. 1), and the current output from the current selection circuit 4 is integrated by the integrating circuit 10 (see FIG. 1) so as to be converted into an analog voltage. The output of the integrating circuit 10 is fed out via the output terminal 28 of the D/A converter. In this way, an analog signal is restored from the digital signal stored in the RAM 17.

Figure 8A:
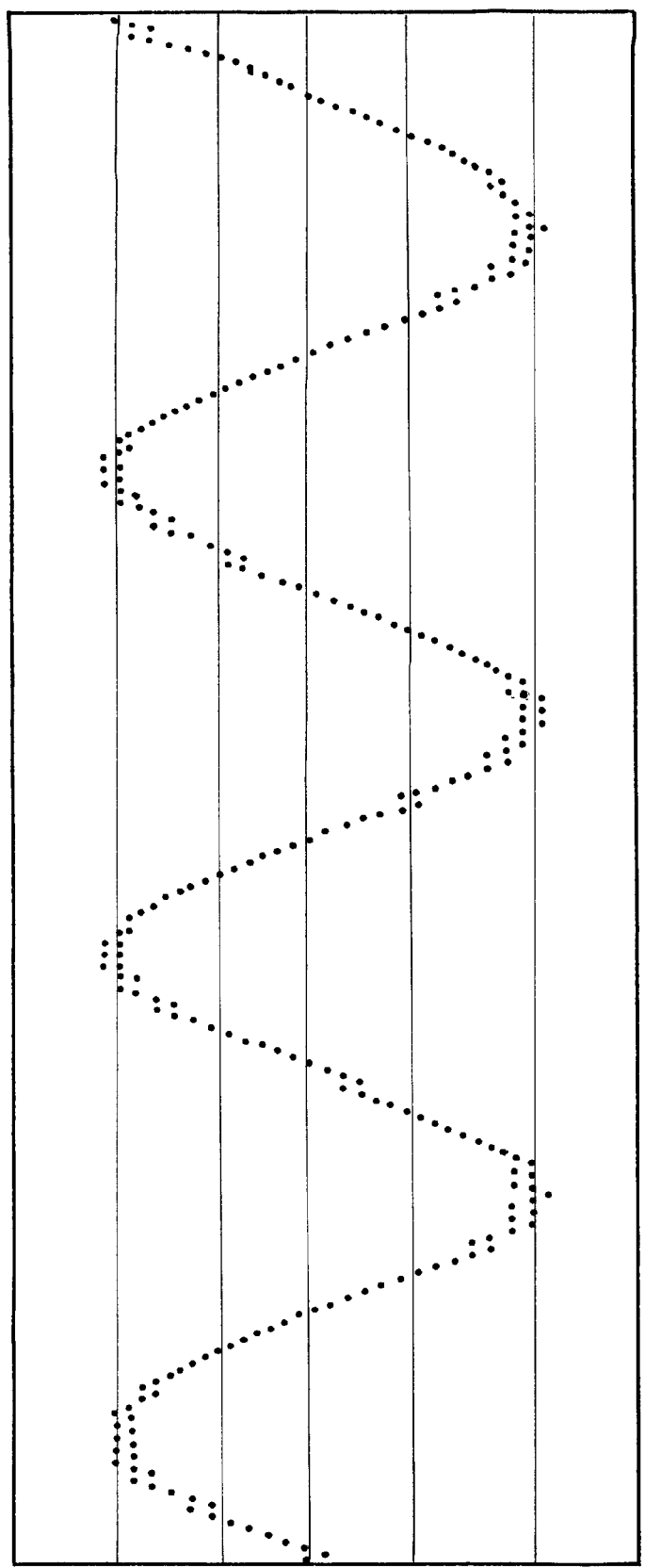
FIGS. 8A and 8B are waveform diagrams illustrating an example of how the D/A converter shown in FIG. 6 operates.
Figure 8B:
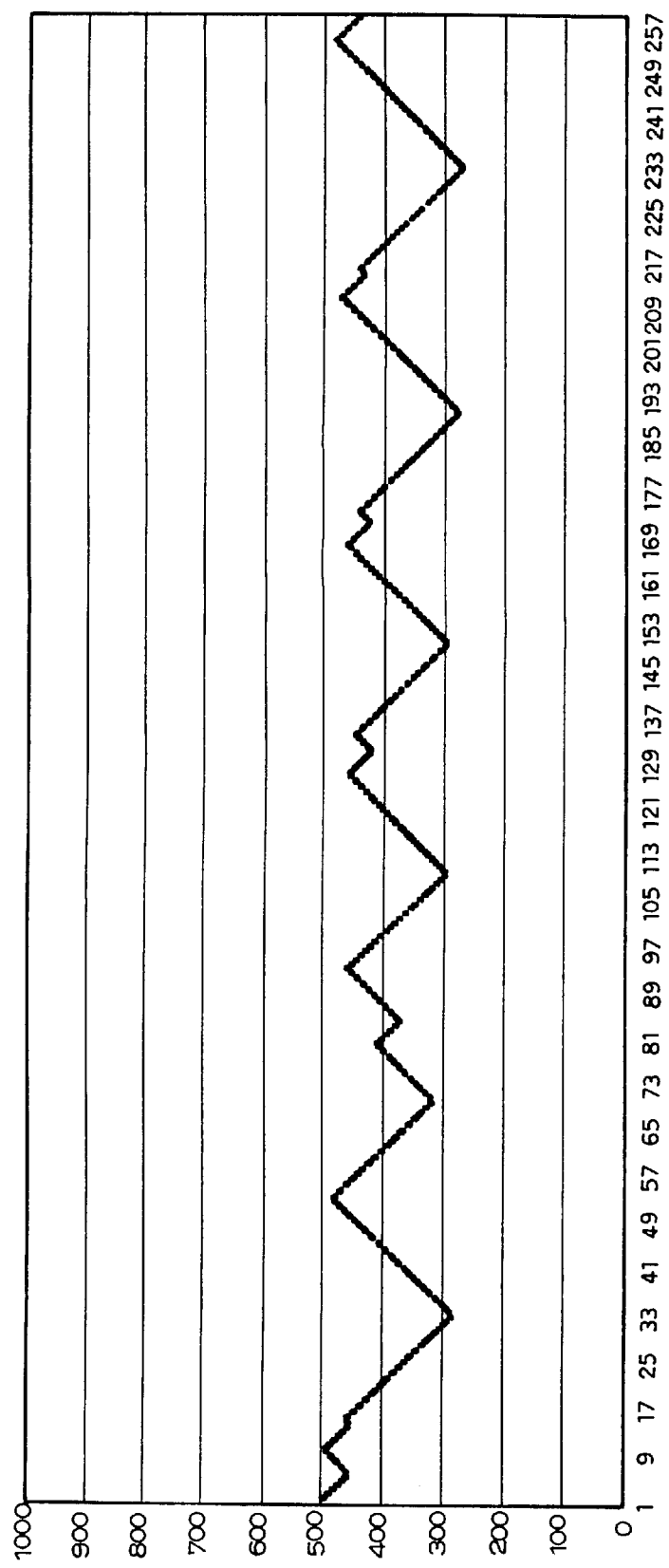

Next, the operation within the D/A converter will be described. FIGS. 8A and 8B are waveform diagrams illustrating the operation as observed when the value stored in the RAM 17 is subjected to D/A conversion performed as shown in FIG. 5 by the use of a data conversion device 1a that is designed to operate as shown in FIG. 5. In FIGS. 8A and 8B, the time lapse is taken along the horizontal axis. In FIG. 8A, the voltage level is taken along the vertical axis, and the dotted line indicates the analog signal output from the data conversion device 1a at every occurrence of a pulse in the clock. On the other hand, in FIG. 8B, the dotted line indicates the value of the signal B at every occurrence of a pulse in the clock. The initial value of the signal B is set at 500, just as in the A/D converter, and the up/down value E is kept constant. In this case, since the initial value of the signal B coincides, the variation of the value of the signal B shown in FIG. 8B coincides with the variation of the value of the signal B in the A/D converter. Thus, as shown in FIG. 8A, the D/A converter outputs a sine wave analogous to the original sine wave.

Figure 9A:
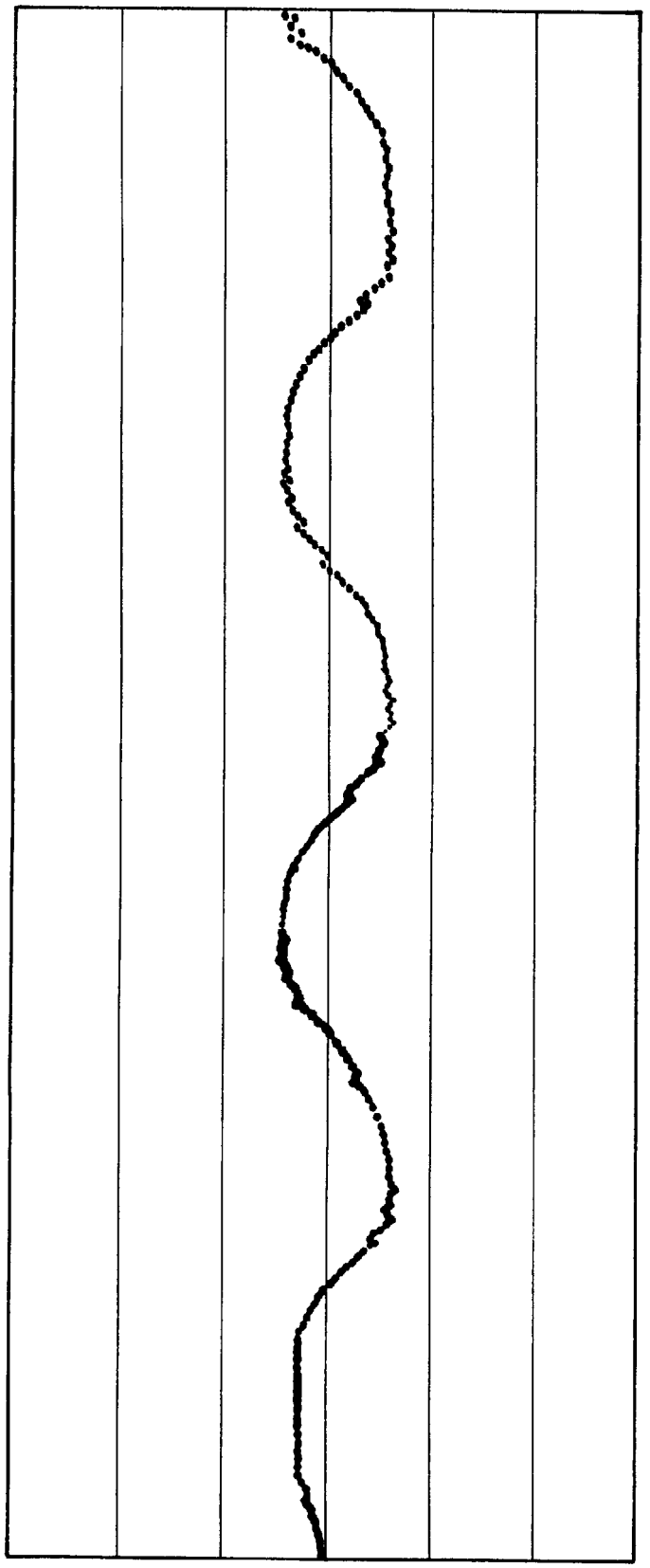
FIGS. 9A and 9B are waveform diagrams illustrating another example of how the D/A converter shown in FIG. 6 operates.
Figure 9B:
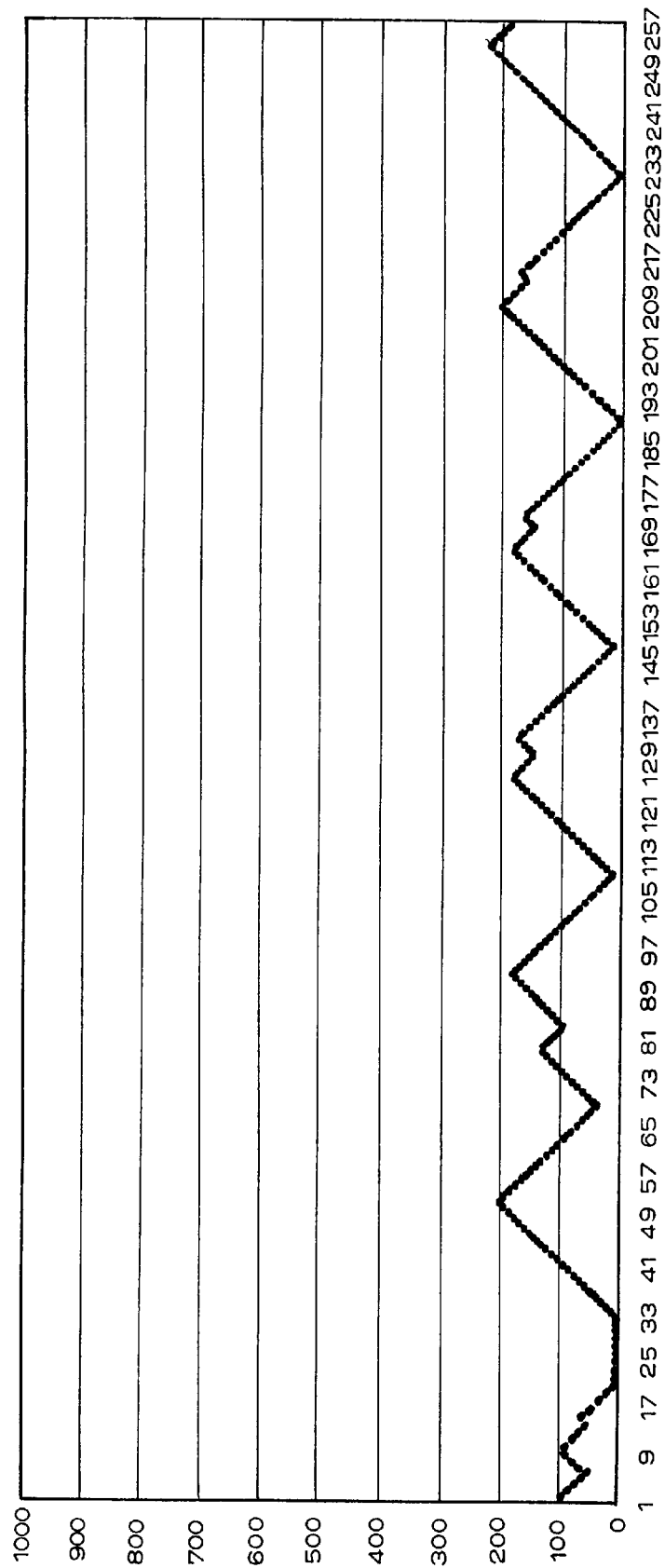

However, as described earlier in connection with the prior art, when the up/down value E is kept constant and the initial value of the signal B in the D/A converter is 100, the D/A converter operates as shown in FIGS. 9A and 9B. In FIGS. 9A and 9B, the time lapse is taken along the horizontal axis. In FIG. 9A, the voltage level is taken along the vertical axis, and the dotted line indicates the analog signal output from the data conversion device 1a at every occurrence of a pulse in the clock. In FIG. 9B, the dotted line indicates the value of the signal B at every occurrence of a pulse in the clock. As shown in FIG. 9B, here, the variation with time of the value of the signal B is the same as the waveform shown in FIG. 8B observed when the initial value is 500 except that the initial value is shifted to be smaller. This causes the current output from the current selection circuit 4 to vary, and thus the amplitude of the analog signal output from the data conversion device 1a becomes smaller as shown in FIG. 9A. In this way, when the up/down value E is kept constant, it is impossible to restore the analog signal.

However, in the data conversion device 1, since the up/down value setting circuit 2 feeds the signals A and B as addresses to the ROM, it is possible to set the up/down value E in accordance with signals A and B. Accordingly, provided that the absolute value of the current is considerably great, in response to the signal B, the up/down value setting circuit 2 outputs the up/down value E in such a way that the value by which the absolute value of the current is increased becomes smaller accordingly as the absolute value of the current becomes greater. In addition, the value by which the absolute value of the current is decreased becomes greater according as the absolute value of the current becomes greater.

Figure 10A:
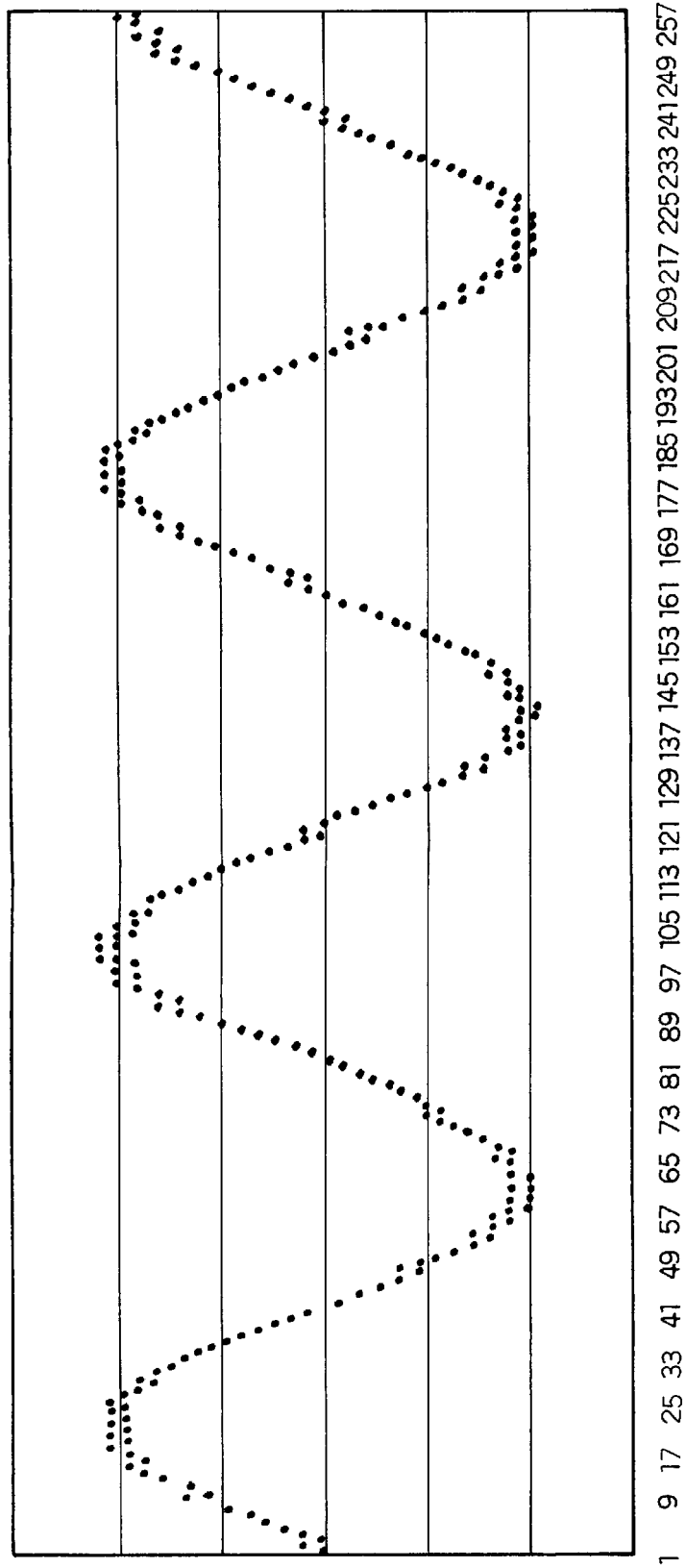
FIGS. 10A and 10B are waveform diagrams illustrating another example of how the D/A converter shown in FIG. 6 operates.
Figure 10B:
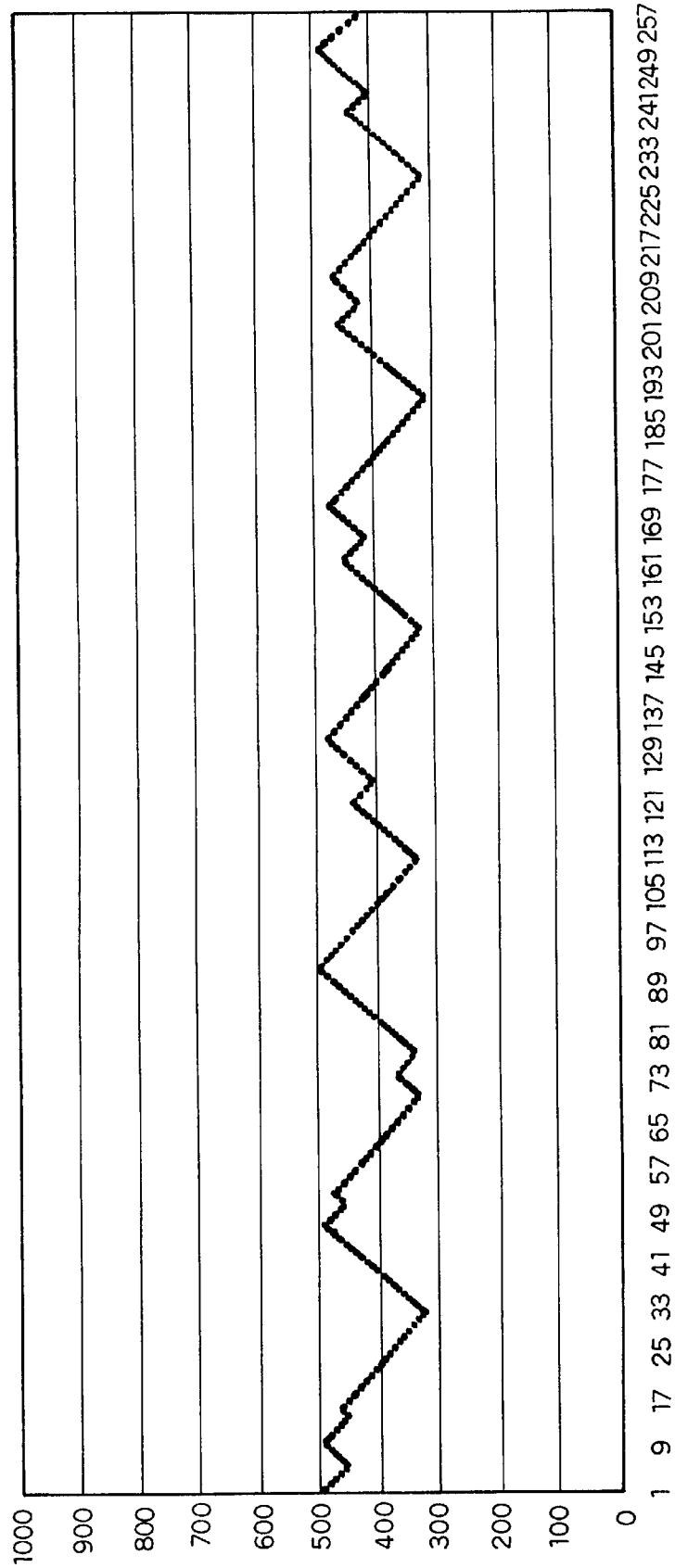

Now, the operation within the D/A converter as observed in this configuration will be described. FIGS. 10A and 10B are waveform diagrams illustrating the operation performed when the digital value stored in the RAM 17 by the A/D converter shown in FIG. 5 is subjected to D/A conversion. The counter 3 operates within a range of values from a minimum value 0 to a maximum value 1000, with the initial value of the signal B set at 500. In FIGS. 10A and 10B, the time lapse is taken along the horizontal axis. In FIG. 10A, the voltage level is taken along the vertical axis, and the dotted line indicates the analog signal output from the data conversion device 1a at every occurrence of a pulse in the clock. In FIG. 10B, the dotted line indicates the value of the signal B at every occurrence of a pulse. Here, since the up/down value E differs between in the A/D converter and in the D/A converter, as shown in FIG. 10B, the variation of the signal B in the D/A converter does not completely coincide with the variation of the signal B in the A/D converter, the latter having exactly the same waveform as shown in FIG. 8B. However, the amplitude of the analog signal output from the D/A converter coincides, and thus it is possible to restore the original analog signal.

Figure 11A:
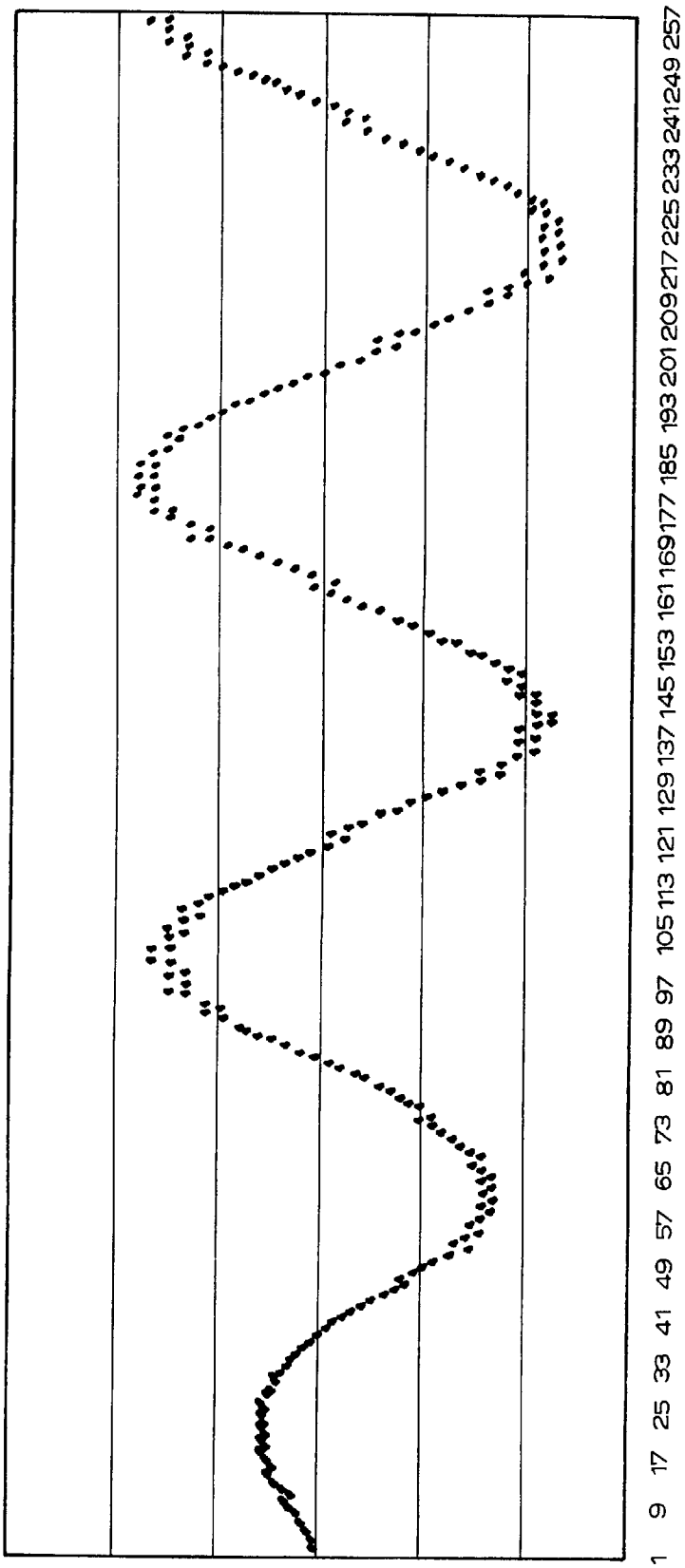
FIGS. 11A and 11B are waveform diagrams illustrating another example of how the D/A converter shown in FIG. 6 operates.
Figure 11B:
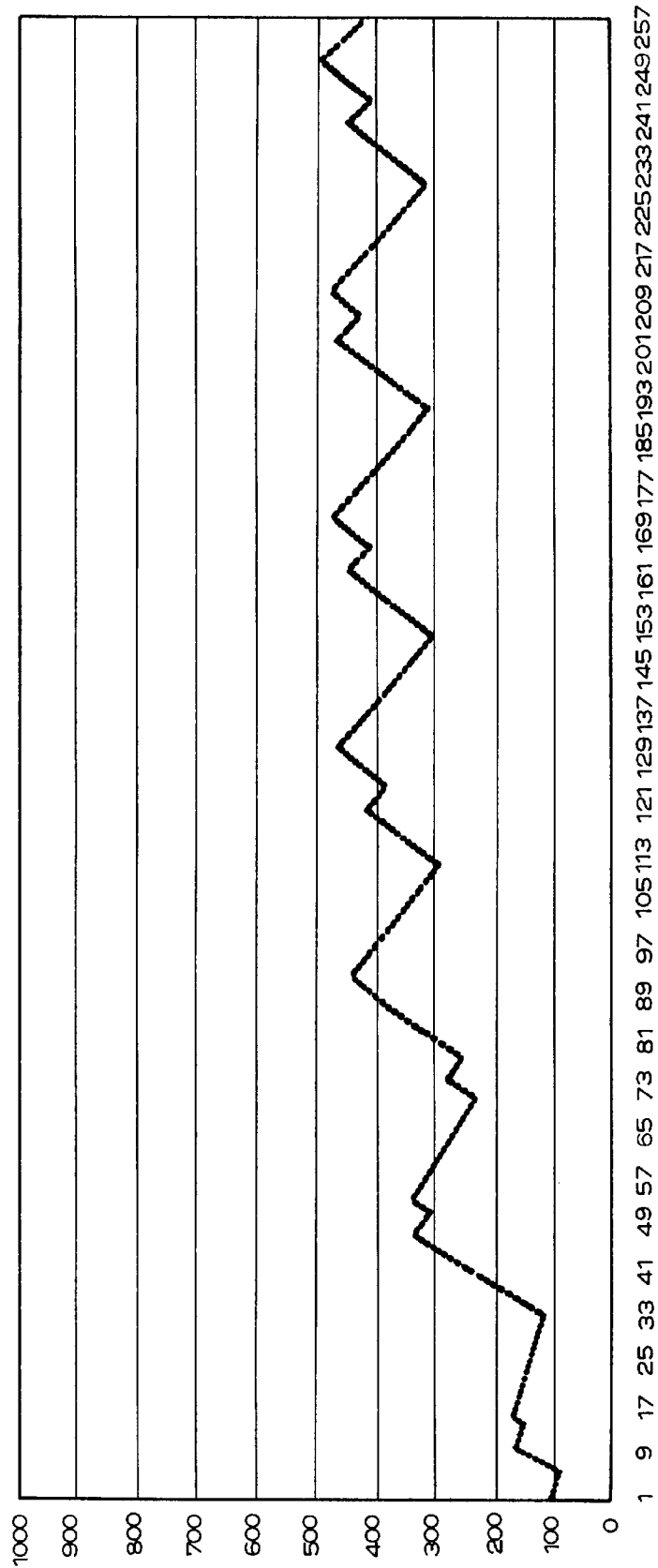

FIGS. 11A and 11B are waveform diagrams illustrating how the D/A converter operates when the initial value is set at 100. The other conditions are the same as for the D/A converter that operates as shown in FIG. 10. In FIGS. 11A and 11B, the time lapse is taken along the horizontal axis. In FIG. 11A, the voltage level is taken along the vertical axis, and the dotted line indicates the analog signal output from the data conversion device 1a at every occurrence of a pulse in the clock. In FIG. 11B, the dotted line indicates the value of the signal B at every occurrence of a pulse in the clock.

In the initial stages of the D/A conversion operation of the D/A converter, as shown in FIG. 11B, the value of the signal B is small, and thus, as shown in FIG. 11A, it is impossible to restore the analog signal. When the up/down signal A is "1", the up/down value E output from the up/down value per one clock pulse setting circuit 2 provided within the data conversion device 1*a* in the D/A converter becomes greater according as the value of the signal B becomes smaller; by contrast, when the up/down signal A is "0", the up/down value E becomes smaller according as the value of the signal B becomes smaller. Accordingly, as time passes, the signal B increases, and the amplitude of the analog signal output from the D/A converter gradually becomes identical with that of the original sine wave. Accordingly, even if the initial value of the signal B differs between in the A/D converter and in the D/A converter, the value of the signal B in the D/A converter gradually becomes equal to that in the A/D converter, and thus it is possible to restore the waveform of the original analog signal.

Figure 12:
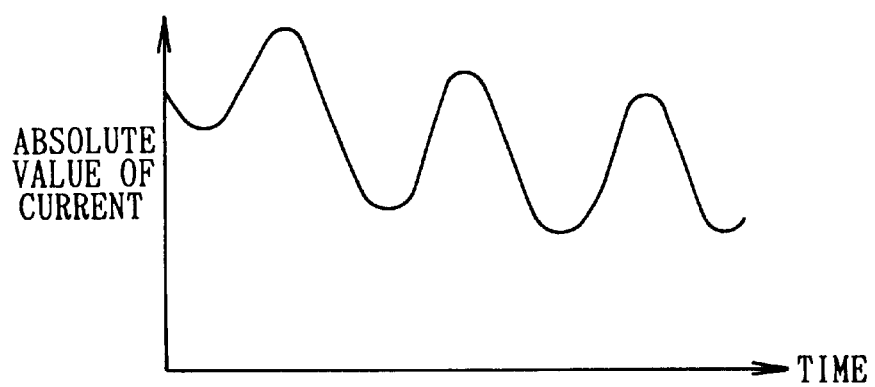
FIG. 12 is a waveform diagram illustrating another example of how the D/A converter shown in FIG. 6 operates.
Figure 13:
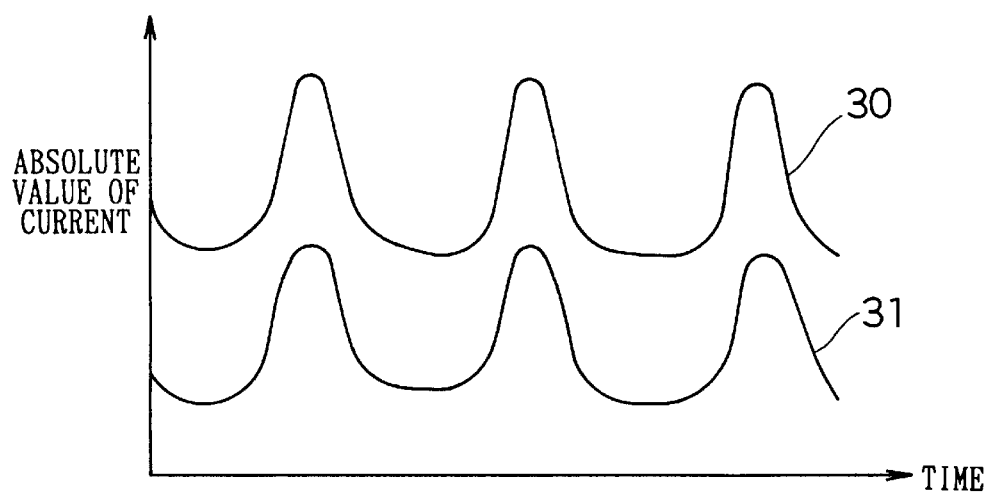
FIG. 13 is a waveform diagram illustrating how a conventional delta-modulation-type data conversion device operates.

FIG. 12 schematically shows the operation of the D/A converter in a cases where the initial value of the absolute value of the current output from the current selection circuit 4 within the data conversion device 1*a* in the D/A converter is greater than the initial value of the absolute value of the current output from the current selection circuit 4 in the A/D converter. In FIG. 12, along the horizontal axis is taken the time lapse, and along the vertical axis is taken the absolute value of the current specified by the signal B and output from the current selection circuit 4. The greater the value of the signal B, the greater the absolute value of this current. As shown in FIG. 12, in the early stages of the D/A conversion operation of the D/A converter, the value of the signal B is great. When the up/down signal A is "1", the up/down value E output from the up/down value setting circuit 2 becomes smaller according as the value of the signal B becomes greater; by contrast, when the up/down signal A is "0", the up/down value E output from the up/down value setting circuit 2 becomes greater according as the value of the signal B becomes greater. Accordingly, as time passes, the signal B decreases, and gradually becomes equal to the value of the signal B in the A/D converter. Accordingly, even if the initial value of the signal B differs between in the A/D converter and in the D/A converter, it is possible to restore the waveform of the original signal in the D/A converter.

As described above, in either case, when the initial value of the absolute value of the current output from the current selection circuit 4 in the D/A converter does not coincide with the initial value of the absolute value of the current output from the current selection circuit 4 in the A/D converter, as time passes, the absolute value of the current in the D/A converter gradually becomes equal to the absolute value of the current in the A/D converter, and thus it is possible to restore the original analog signal. Accordingly, it is not necessary to store in the RAM 17 the initial value data of the absolute value of the current in order for the D/A converter (FIG. 6) to restore the original analog signal. That is, the A/D converter (FIG. 1) does not need to store the initial value data of the absolute value of the current in the RAM 17. Moreover, since it is possible to restore data even when the initial value of the current differs between in the D/A converter and in the A/D converter, it is possible to restore the analog signal starting at an arbitrary point in the digital signal stored in the RAM 17.

It is to be understood that a data conversion device embodying the present invention can be realized in similar configurations either by the use of bipolar devices or by the use of MOS devices. Moreover, the integrating circuit 10 does not necessarily have to be configured exactly as shown in FIG. 1, but may be configured in any way as long as it can convert a current into a voltage.

What is claimed is:

1. A data conversion device of a delta modulation type, comprising:

a comparator for comparing a sinusoidal analog input signal with a reference voltage to convert the input signal into a binary digital signal; and a reference voltage supplying circuit for feeding the reference voltage to the comparator, said reference voltage supplying circuit comprising:

a current output circuit for outputting a current and varying a direction and a magnitude of the output current;

a current-to-voltage conversion circuit for converting the current output from the current output circuit into a voltage and feeding the voltage to the comparator;

an absolute value signal generating circuit for feeding the current output circuit with an absolute value signal that governs an absolute value of the current output from the current output circuit;

an up/down circuit for determining, on a basis of an output of the comparator, whether to increase or decrease the magnitude of the current output from the current output circuit and feeding a signal representing a result of the determination to the absolute value signal generating circuit; and an up/down value output circuit for outputting an up value and a down value on a basis of a signal output from the absolute value signal generating circuit and the signal output from the up/down circuit, wherein, when the absolute value signal is large, the up/down value output circuit decreases the up value, by which the absolute value signal is to be increased, and increases the down value, by which the absolute value signal is to be decreased.

2. A data conversion device as claimed in claim 1, wherein the absolute value signal generating circuit is fed with clock pulses to refresh the absolute value signal on receipt of each of the clock pulses.

3. A data conversion device as claimed in claim 2, further comprising:

a flip-flop for latching the output of the comparator in synchronization with the clock pulses, wherein an output of the flip-flop is fed to the up/down circuit and the current output circuit.

* * * * *